US006440766B1

(12) United States Patent
Clark (10) Patent No.: US 6,440,766 B1
(45) Date of Patent: Aug. 27, 2002

(54) MICROFABRICATION USING GERMANIUM-BASED RELEASE MASKS

(75) Inventor: William A. Clark, Fremont, CA (US)

(73) Assignee: Analog Devices IMI, Inc., Berkeley, CA (US)

(*) Notice: Subject to any disclaimer, the term of this patent is extended or adjusted under 35 U.S.C. 154(b) by 0 days.

(21) Appl. No.: 09/612,563

(22) Filed: Jul. 7, 2000

Related U.S. Application Data

(60) Provisional application No. 60/183,502, filed on Feb. 16, 2000.

(51) Int. Cl.[7] .............................................. H01L 21/00

(52) U.S. Cl. ............... 438/52; 438/752; 148/DIG. 159; 216/2; 216/11

(58) Field of Search .............................. 438/52–53, 752, 438/756, 757, 750, 751, FOR 127, FOR 432; 148/DIG. 159; 216/2, 11

(56) References Cited

U.S. PATENT DOCUMENTS

| | | |
|---|---|---|
| 5,029,324 A | 7/1991 | Osawa et al. |
| 5,326,726 A | 7/1994 | Tsang et al. |
| 5,343,064 A | 8/1994 | Spangler et al. |
| 5,495,761 A | 3/1996 | Diem et al. |
| 5,504,026 A | 4/1996 | Kung |
| 5,506,175 A | 4/1996 | Zhang et al. |
| 5,574,222 A | 11/1996 | Offenberg |
| 5,576,250 A | 11/1996 | Diem et al. |
| 5,578,755 A | 11/1996 | Offenberg |
| 5,616,523 A | 4/1997 | Benz et al. |
| 5,627,317 A | 5/1997 | Offenberg et al. |
| 5,627,318 A | 5/1997 | Fujii et al. |
| 5,631,422 A | 5/1997 | Sulzberger et al. |
| 5,659,195 A | 8/1997 | Kaiser et al. |

(List continued on next page.)

OTHER PUBLICATIONS

King, T.–J., et al., "Electrical properties of heavily doped polycrystalline–silicon–germanium films," *IEEE Transactions on Electron Devices*, Feb. 1994, pp. 228–232.

Tsu–Jae King, Saraswat, K.C., "Deposition and properties of low–pressure chemical–vapor deposited polycrystalline silicon–germanium films," *Journal of the Electrochemical Society*, Aug. 1994, pp. 2235–2241.

Sedky, S., et al., "Thermally insulated structures for IR bolometers, made of polycrystalline silicon germanium alloys," *Transducer 97*, Jun. 16–19, 1997. pp. 237–240.

Matsumoto, Y., et al., "Fluorocarbon film for protection from alkaline etchant and elimination of in–use stiction," *Tranducers 97*, Jun. 16–19, 1997. pp. 695–698.

(List continued on next page.)

*Primary Examiner*—George Fourson
*Assistant Examiner*—Thanh V Pham
(74) *Attorney, Agent, or Firm*—Vierra Magen Marcus Harmon & DeNiro LLP

(57) ABSTRACT

A method of fabricating MicroElectroMechanical systems. The method includes: providing a substrate in which electrical interconnections and a sacrificial layer have been formed, forming a release mask including germanium, etching exposed sacrificial material, and removing the release mask. The performance of MicroElectroMechanical devices is improved by 1) integrating electronics on the same substrate as the mechanical elements, 2) increasing the proximity of electronics and mechanical elements, 3) increasing the undercut of a release etch to reduce or eliminate etch holes or to allow circuit elements to be undercut, 4) increasing the yield and reliability of the MEMS release processes. In addition to released mechanical structures, the invention also provides a means for forming circuits such as a bandgap reference as a released MEMS element. Forming a bandgap circuit as a released MEMS element may improve reference voltage performance by allowing resistive heating of the circuit region to a constant, elevated temperature independent of the substrate temperature.

23 Claims, 4 Drawing Sheets

U.S. PATENT DOCUMENTS

| | | | |
|---|---|---|---|
| 5,721,162 A | * | 2/1998 | Schubert et al. |
| 5,723,353 A | | 3/1998 | Muenzel et al. |
| 5,747,353 A | | 5/1998 | Bashir et al. |
| 5,756,901 A | | 5/1998 | Kurle et al. |
| 5,798,283 A | | 8/1998 | Montague et al. |
| 5,811,344 A | | 9/1998 | Tu et al. |
| 5,846,849 A | * | 12/1998 | Shaw et al. |
| 5,847,280 A | | 12/1998 | Sherman et al. |
| 5,871,811 A | | 2/1999 | Wang et al. |
| 5,882,532 A | | 3/1999 | Field et al. |
| 5,963,788 A | | 10/1999 | Barron et al. |
| 6,121,552 A | * | 9/2000 | Brosnihan et al. |
| 6,170,332 B1 | * | 1/2001 | MacDonald et al. |
| 6,199,874 B1 | * | 3/2001 | Galvin et al. |
| 6,210,988 B1 | * | 4/2001 | Howe et al. |
| 6,238,580 B1 | * | 5/2001 | Cole et al. |

OTHER PUBLICATIONS

Sedky, S., et al., "Structural and mechanical properties of polycrystalline silicon germanium for micromachining applications," *Journal of Microelectromechanical Systems,* Dec. 1998, pp. 365–372.

Franke, A.E., et al., "Post–CMOS Integration of Germanium Microstructures," IEEE International MEMS 99 Conference, Orlando, FL, Jan. 17–21, 1999, pp. 630–637.

Li, B., et al., "Applications of germanium to low temperature micro–machining," IEEE International MEMS 99 Conference, Orlando, FL, Jan. 17–21, 1999, pp. 638–643.

Franke, A.E., et al., "Optimization of poly–silicon–germanium as a microstructural material," *Tranducers 99,* Jun. 7–10, 1999. pp. 530–533.

Heck, J., et al., "High aspect ratio poly–silicon–germanium microstructures," *Transducers 99,* Jun. 7–10, 199, pp. 530–533.

* cited by examiner

MICROFABRICATION USING GERMANIUM-BASED RELEASE MASKS

CROSS-REFERENCE TO RELATED APPLICATION

This application claims priority to Provisional Application Serial No. 60/183,502 filed Feb. 16, 2000 entitled "MICROFABRICATION USING GERMANIUM-BASED RELEASE MASKS."

IDENTIFICATION OF GOVERNMENT INTEREST

This invention was made with government support under contract number DAA01-99-C-R215 awarded by the Defense Advanced Research Projects Administration (DARPA). The government has certain rights in the invention.

BACKGROUND OF THE INVENTION

1. Field of the Invention

This invention relates generally to microfabricated devices, and more particularly to devices fabricated using silicon oxide or similar material as a sacrificial layer. This invention improves release of mechanical devices formed on the same substrate as integrated circuitry using conventional microfabrication techniques.

2. Description of the Related Art

MicroElectroMechanical Systems (MEMS) combine mechanical structures and microelectronic circuits to create integrated devices. MEMS have many useful applications such as microsensors and microactuators. Examples of microsensors include inertial instruments such as accelerometers and gyroscopes, detectors for gasses such as carbon-monoxide, and pressure sensors. Examples of microactuators include optical mirrors used for video displays, optical switches, or multiplexors, and disk-drive head actuators used for increasing track density.

Many MEMS fabrication methods and techniques are known to those skilled in the art and are documented in publications such as Education in Microelectronics and MEMS by Payne, et al., the IEEE Journal of MicroElectro-Mechanical Systems, and numerous national and international conferences including: IEEE Solid-State Sensor and Actuator Workshop, IEEE International Conference on Solid-State Sensors and Actuators, and IEEE International Conference on Micro Electro Mechanical Systems. Many of the mechanical elements in MEMS devices are formed using layers of structural and sacrificial materials. A layer of sacrificial material typically supports structural materials during manufacture. The sacrificial layers are generally removed near the end of the manufacturing process to release the mechanical structures from surrounding materials. This is accomplished using a release etch which is typically isotropic and highly selective to the sacrificial material, leaving the structural material largely unaffected. Often a long release etch is required to undercut structural materials for a distance many times greater than the thickness of the sacrificial material. In many cases, etch holes are included in the structural material in an attempt to minimize the required undercutting and thereby shorten the release etch. Minimization of required undercutting can result in closely spaced etch holes that significantly constrain the mechanical design of a structure and reduce the performance of the MEMS device.

In many cases, MEMS sacrificial materials such as silicon oxides are also used in integrated circuits. When circuits are integrated with structures that require a release etch, the integrated circuits must be protected from the release etch. When silicon oxides are used as a sacrificial material, hydrofluoric acid based solutions or vapors may be used as the release etchant. Hydrofluoric based release etches include hydrogen fluoride vapor, hydrofluoric acid, buffered hydrofluoric acid, and various pad etchants. These release etchants can damage unprotected integrated circuitry, particularly when significant undercut is required.

Depositing a release mask may provide protection for integrated circuits and other sensitive elements. The release mask must not only be acid resistant but also impermeable. Since integrated circuits typically include aluminum interconnect, the release mask must also be deposited and removed at temperatures less than 450° C. using compatible materials. A variety of organic coatings have been employed as release masks but have proven inadequate for heavily undercutting release etches. Films deposited using chemical vapor deposition (CVD), low pressure CVD (LPCVD), plasma enhanced CVD (PECVD) have also been considered as a release mask. For example, amorphous silicon can be deposited over aluminum metallization using LPCVD or PECVD and can be an effective release mask, however, removal of amorphous silicon without damaging other materials can prove problematic. Other PECVD materials may also be deposited at lower temperatures but typically have poor conformality and are typically low-quality materials and therefore unsuitable as a release mask.

An effective release mask may improve performance, cost, manufacturability, and reliability of MEMS devices. A durable release mask may enable more undercutting during release etches thereby increasing the maximum etch-hole spacing, or even eliminating etch holes that constrain structure design. Large, more elaborate structures may also be designed, including MEMS systems comprising structures, electrical interconnection, and circuitry. The release etch may also be performed using a more aggressive etchant saving fabrication time and expense. Furthermore, the performance of devices such as sensors and actuators may benefit from combining mechanical structures with circuits integrated in the same substrate. Such MEMS devices are often improved as the distance diminishes between mechanical elements and the release-etch-sensitive elements. Increased proximity can reduce parasitic resistance and capacitance associated with electrical interconnect. Reduced parasitic resistance and capacitance yields higher electrical performance and hence a better performing MEMS device. Increased proximity of the different MEMS elements also lowers fabrication costs by increasing the number of batch fabricated components per substrate thereby reducing the cost per component.

SUMMARY OF THE INVENTION

The invention is directed to a method of fabricating MEMS systems. The method includes: providing a substrate in which integrated circuits and a sacrificial layer have been formed, forming a release mask including germanium, etching exposed sacrificial material, and removing the release mask. The release mask provides protection for materials that may be adversely affected by the release etch. The mask may be removed without affecting other materials. This invention may potentially be used with a variety of MEMS processes, see for example: U.S. PPA Serial No. 60/127,973, Filed Apr. 6, 1999; U.S. patent application Ser. No. 09/322, 381, filed May 28, 1999; Montague et al., U.S. Pat. No. 5,798,283 issued Aug. 25, 1998; Kung, et al., U.S. Pat. No. 5,504,026 issued Apr. 2, 1996; Sherman, et al., U.S. Pat. No.

5,847,280 issued Dec. 8, 1998; Tsang et al., U.S. Pat. No. 5,326,726, issued Jul. 5, 1994; Spangler et al., U.S. Pat. No. 5,343,064, issued Aug. 30, 1994; Bashir et al., U.S. Pat. No. 5,747,353, issued May 5, 1998; Zhang et al, U.S. Pat. No. 5,506,175 issued Apr. 9, 1996; Diem et al., U.S. Pat. No. 5,576,250, issued Nov. 19, 1996.

Implementations of the invention may include the following. Circuit elements may be formed in the substrate including active devices such as transistors. Electrical interconnection may be formed among circuit elements and structural elements. Electrical circuits and electrical interconnection may involve materials that may be adversely affected by a release etch. The structural elements may comprise materials that are not adversely affected by a release etch. The circuit and/or structural elements may be supported by or connected to sacrificial materials that may be removed by a release etch. A temporary release mask may be deposited and defined to allow a release etch to remove sacrificial materials where desirable while leaving other materials undisturbed. The temporary release mask may be removed using an etch process that will not damage materials used in the MEMS device including electrical circuits, interconnection, and structural elements. Sacrificial materials may include silicon oxides either grown on silicon or deposited on the substrate using CVD, LPCVD, or PECVD. Structural materials may include, for example, single crystal silicon, polycrystalline silicon (polysilicon), or silicon nitride deposited using CVD, LPCVD, or PECVD. The release etch may be performed using any of many known silicon-oxide etching chemistries including hydrofluoric acid (HF) or buffered hydrofluoric acid (BHF or BOE). The temporary release mask may be an amorphous or a polycrystalline germanium/silicon mixture deposited using CVD, LPCVD, or PECVD. When the release mask is largely germanium, the temporary release mask removal may be accomplished with an oxidizing etch including water, a hydrogen peroxide solution, or an oxygen plasma.

Advantages of the invention include the following. Performance of devices fabricated in accordance with the invention are improved due to the proximity of interface circuitry built into the same substrate as the microstructures. Proximity of circuitry and microstructures also reduces the cost of manufacture. Etch hole spacing can be increased, providing added flexibility of mechanical structure design. When etch holes can be fully eliminated, depending on the particular MEMS technology, mechanical devices may be suspended from a limited number of locations thereby reducing the effect of substrate stress from, for example, forces applied to a package. In addition to released mechanical structures, the invention also provides a means for forming circuits such as a bandgap reference as a released MEMS element. Addition of a robust temporary release mask allows for greater undercut, more aggressive release-etch chemistries, more robust manufacturing methods, and higher yields. Furthermore, the invention is compatible with existing microfabrication techniques and is compatible with established integrated circuit fabrication processes. Additional benefits are derived from the use of germanium as the temporary release mask. Germanium can be impermeable to and is not attacked by many release etchants. Germanium may be deposited conformally at temperatures low enough to ensure that circuit components such as transistors and metallization are largely unaffected. Conformal deposition ensures the release mask is effective over topology on which the mask is deposited. Germanium is also easily removed without causing damage to materials commonly found in semiconductor processing making germanium an ideal release mask for integrated MEMS.

BRIEF DESCRIPTION OF THE DRAWINGS

For a better understanding of the nature and objects of the invention, reference should be made to the following detailed description taken in conjunction with the accompanying drawings, in which.

DETAILED DESCRIPTION OF THE INVENTION

Fabrication of devices in accordance with the present invention comprises three basic steps: deposition of the temporary release mask, a release etch to remove exposed sacrificial material, and removal of the temporary release mask. The present invention makes use of three regions: the protected region that may include electronics and/or electrical interconnect, the exposed region that may include the MEMS structural elements and sacrificial material, and the release seal that separates the exposed and protected regions.

Figure 1:
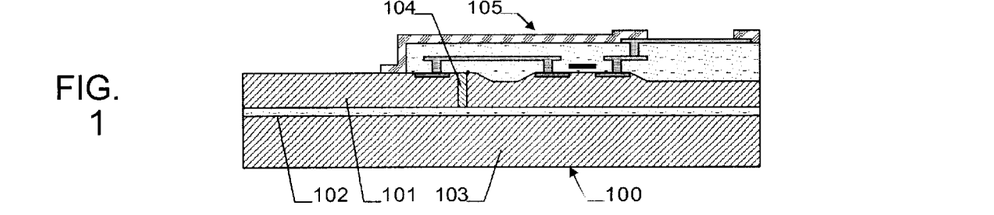
FIG. 1 is a cross-sectional view of a substrate containing a region in which a MEMS device will be formed and a region containing electronics.

Referring to FIG. 1, a first embodiment of the present invention begins with starting material comprising a substrate 100. The substrate 100 may comprise a substantially conventional bonded wafer structure having a number of layers including: handle layer 103, sacrificial material 102, device layer 101, dielectric isolation trenches 104 formed through device layer 101, and a protected region 105 that may include electronics and/or electrical interconnect. While different materials may be used, handle layer 103 may be single crystal silicon; sacrificial layer 102 may include silicon dioxide; and the device layer 101 may be single crystal silicon. The protected region 105 may comprise a variety of materials that may include: single crystal silicon, polycrystalline silicon, silicon dioxide, aluminum, copper, tungsten, silicon nitride, spin-on-glass, or silicon carbide. Several methods of forming substrate 100 are described in prior art (refer to U.S. patent application Ser. No. 09/322,381 filed May 28, 1999 and "An SOI Based, Fully Integrated Fabrication Process for High-Aspect-Ratio Microelectromechanical Systems," Doctoral Thesis, Brosnihan, U.C. Berkeley, Fall 1998).

Figure 2:
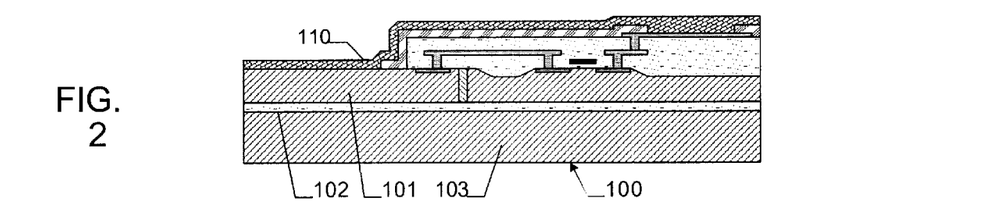
FIG. 2 is a cross-sectional view of a substrate after the deposition of a temporary release mask.

As illustrated in FIG. 2, temporary release mask 110 is deposited on substrate 100. Temporary release mask 110 includes germanium, and may include silicon, deposited using CVD, LPCVD, PECVD or sputter processes. Removal of native oxide prior to deposition will improve the deposition and the efficacy of the temporary release mask 110. Native oxide may be removed with a brief oxide etch using many known chemistries including solutions containing hydrofluoric acid or a fluorine based plasma. LPCVD deposition of silicon/germanium films may be accomplished by alternating layers of silicon and germanium. Amorphous silicon may be deposited using an LPCVD furnace held at 350° C. and 300 mTorr while flowing 200 sccm of disilane for 20 minutes resulting in a film thickness of 5 nm to 10 nm. Deposition of a thin amorphous silicon layer typically precedes germanium deposition for improved mask quality.

Figure 7:
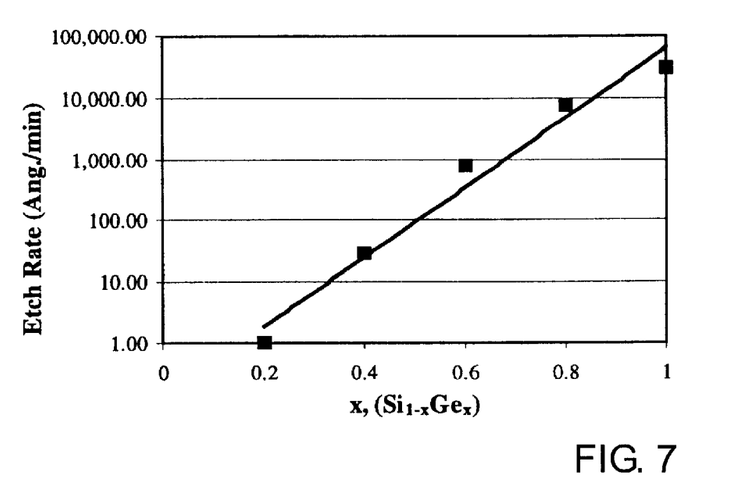
FIG. 7 is a plot which relates the etch rate of germanium/silicon in an oxidizing solution as a function of the mole fraction of germanium.

Polycrystalline germanium may be deposited in an LPCVD furnace held at 350° C. and 600 mTorr while flowing 88 sccm of germane, for 30 minutes resulting in a film thickness of approximately 200 nm. Additionaly, silane and/or disilane may be added to the germane to increase the silicon content of the silicon/germanium film. Dopant gasses such as phosphene or diborane may also be used in the deposition. The use of alternating layers of silicon and silicon/germanium or germanium may be used to reduce the formation of pinholes that can violate the integrity of release mask 110. Provided that the germanium and silicon depositions interdiffuse resulting in a film with high germanium concentration, the temporary release mask may be removed using an oxidizing solution as evidenced by FIG. 7, a plot of germanium etch rates in a hydrogen peroxide solution taken from "Post-CMOS Integration of Germanium Microstructures" by A. E. Franke, et al., published in the $12^{th}$ IEEE International Conference on MEMS. Germanium-rich silicon/germanium may be etched using many known oxidizing chemistries including hydrogen peroxide solution heated to 90° C. or an oxygen plasma.

Figure 3:
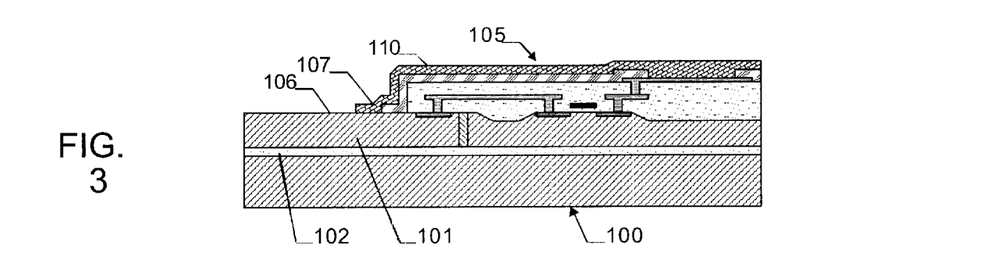
FIG. 3 is a cross-sectional view of a substrate after patterning of a temporary release mask.

Referring to FIG. 3, definition of temporary release mask 110 is accomplished by removing material from regions 106 that will be exposed to a release etch. Removal of material from regions 106 may be accomplished using lithographic techniques coupled with a wet etch process or plasma etch process. Temporary release mask 110 is defined to cover protected region 105, cover release seal region 107, and expose region 106. Release seal 107 may include regions where the temporary release mask 110 makes intimate contact with materials that are not adversely affected by the release etch such as device layer 101 and isolation trenches 104.

Figure 4:
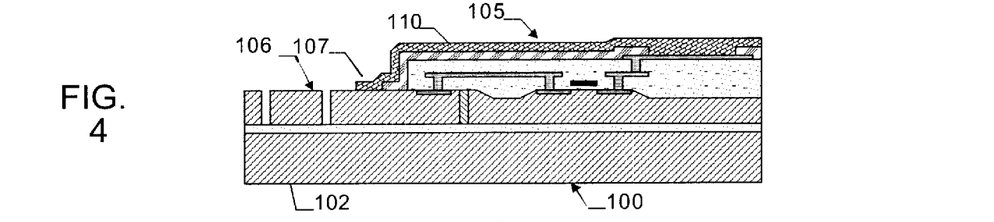
FIG. 4 is a cross-sectional view of a substrate after a structural etch has been performed in the MEMS region exposed through the temporary release mask.
Figure 5:
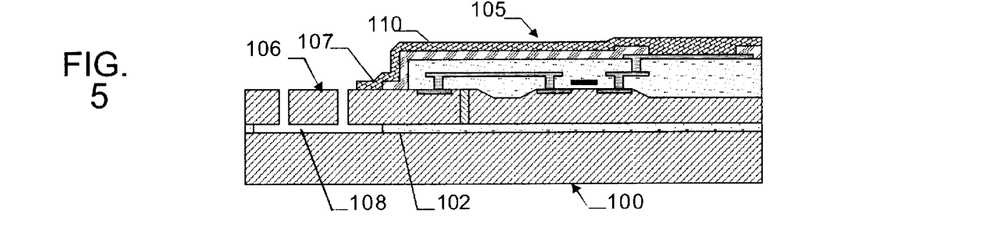
FIG. 5 is a cross-sectional view after the completion of the release etch that removed the sacrificial material underlying the MEMS device.
Figure 6:
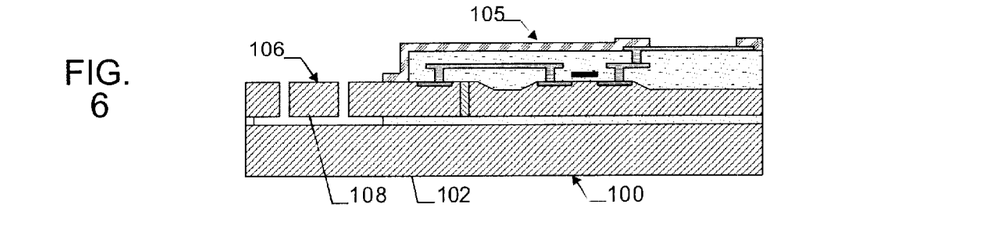
FIG. 6 is a cross-sectional view of the MEMS device after the removal of the temporary release mask.

In the present embodiment of the invention, definition of the MEMS structure is performed in exposed region 106 as shown in FIG. 4. Once this structural etch is complete, underlying sacrificial silicon oxide 102 is exposed. A release etch may now be performed removing regions of sacrificial silicon oxide 102 as illustrated in FIG. 5. The release etchant may be one of many known chemistries including hydrofluoric acid, hydrogen fluoride vapor, or buffered oxide etchant. Following the release etch, temporary release mask 110 is removed using an oxidizing etch leaving behind the MEMS device shown in FIG. 6. These etches result in MEMS elements that are released from handle layer 103. Fully and partially released MEMS elements may include structural elements 108 and protected regions 105. When the released region includes protected circuits, improved circuits such as a thermally controlled bandgap voltage reference may be realized (refer to Reay, et al., "A micromachined low-power temperature-regulated bandgap voltage reference," IEEE Journal of Solid-State Circuits, December 1995)

Figure 8:
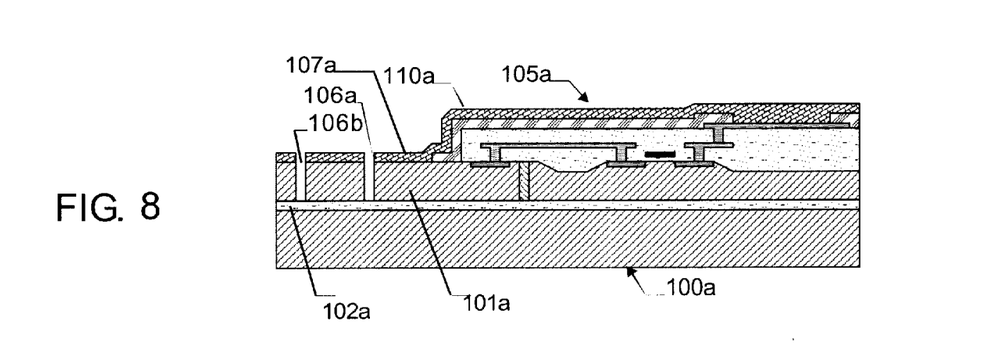
FIG. 8 is a cross-sectional view illustrating a release mask patterned using the MEMS structural etch.

In an alternate embodiment of the invention, a separate step for defining temporary release mask 110, illustrated in FIG. 3, is eliminated. Referring to FIG. 8, the MEMS structural etch also defines exposed regions 106a and 106b. When the temporary release mask 110a is largely comprised of germanium and the device layer 101a comprises silicon, the same plasma or reactive ion etch used to etch the device layer 101 a may often be used to etch the release mask 110a owing to the chemical similarity between materials. Alternatively, a separate etch process may be employed to remove temporary release mask 110a in the exposed regions 106a and 106b prior to the structure etch.

Figure 9:
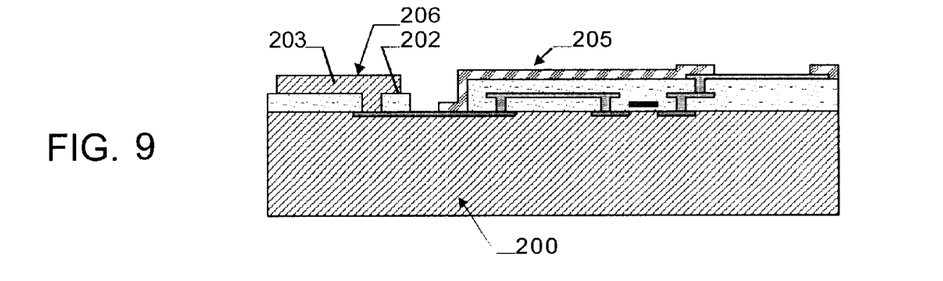
FIG. 9 is a cross-sectional view of a substrate containing a region of electronics and an unreleased MEMS device.
Figure 10:
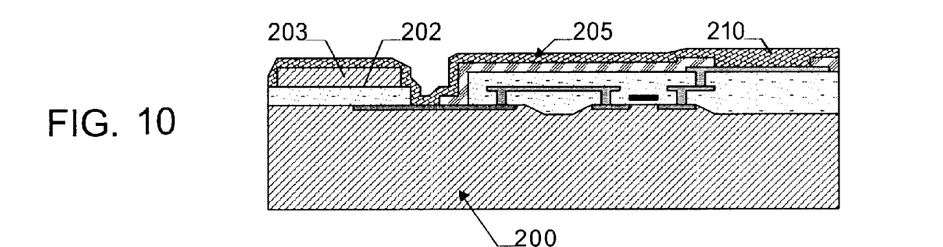
FIG. 10 is a cross-sectional view of a substrate containing a MEMS device and electronics coated with a temporary release mask material.
Figure 11:
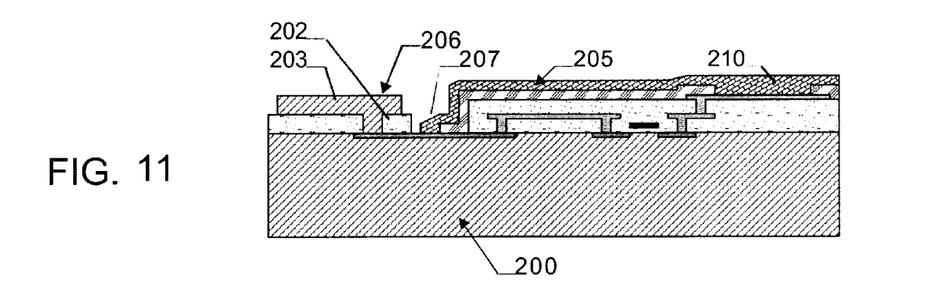
FIG. 11 is a cross-sectional view of a temporary release mask protecting a region of a substrate and exposing a MEMS device for a release etch.
Figure 12:
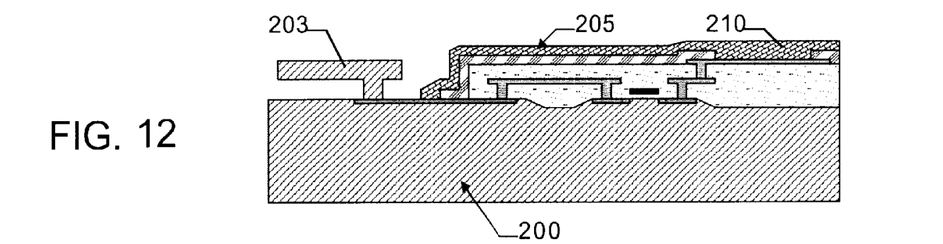
FIG. 12 is a cross-sectional view of a released MEMS structure adjacent to a region protected by a temporary release mask.
Figure 13:
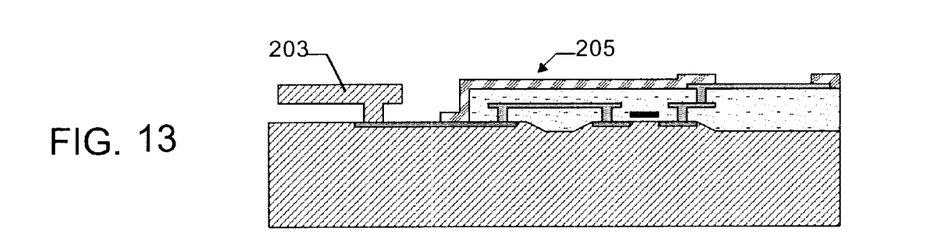
FIG. 13 is a cross-sectional view of a released MEMS structure adjacent to a region of electronics.
Figure 14:
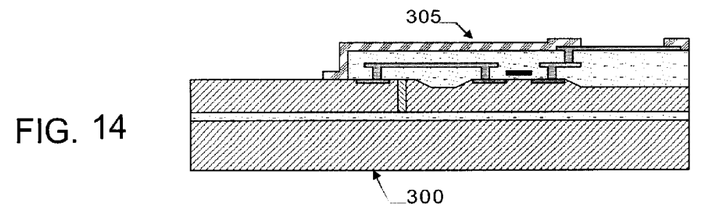
FIG. 14 is a cross-sectional view of a substrate containing a region in which a MEMS device will be formed and a region containing electronics.

In another embodiment of the invention, starting material may comprise a substrate 200, a protected region 205, and a region in which MEMS devices are formed 206 as illustrated in FIG. 9. While different materials may be used, the substrate may comprise single crystal silicon, polycrystalline silicon, or epitaxial single crystal silicon. Protected region 205 may comprise a variety of materials including: single crystal silicon, polycrystalline silicon, silicon oxide, aluminum, copper, tungsten, silicon nitride, spin-on-glass, or silicon carbide. The MEMS device area may contain sacrificial material 202 such as silicon oxide. Additionally the MEMS device area may include structural materials 203 such as single crystal silicon, polycrystalline silicon, amorphous silicon, silicon nitride, silicon carbide, and high silicon content silicon/germanium. Examples of similar starting materials are described in prior art (refer to Tsang et al., U.S. Pat. No. 5,326,726 issued Jul. 5, 1994; Montague et al., U.S. Pat. No. 5,798,283 issued Aug. 25, 1998; Kung, et al., U.S. Pat. No. 5,504,026 issued Apr. 2, 1996; and Sherman, et al., U.S. Pat. No. 5,847,280 issued Dec. 8, 1999). Referring to FIG. 10, a brief oxide etch to remove residual or native oxide may be performed before depositing temporary release mask 210 on substrate 200. Temporary release mask 210 includes germanium and may include silicon. To preserve the integrity of release seal 207, there is preferably no silicon oxide exposed at the edges of temporary release mask 210 in the region of the release seal 207. Referring to FIG. 11, temporary release mask 210 is defined to expose MEMS region 206 while remaining over protected region 205 and release seal 207. As illustrated in FIG. 12, a release etch may be used to remove sacrificial silicon oxide 202 thereby releasing structural elements 203 from the substrate. Temporary release mask 210 may now be removed as shown in FIG. 13.

Figure 15:
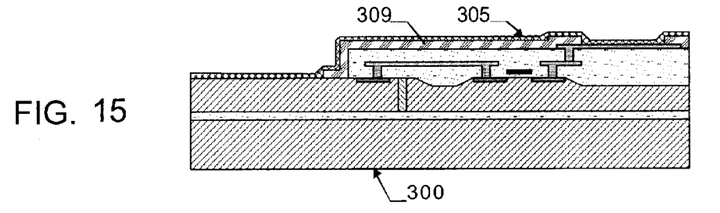
FIG. 15 is a cross-sectional view of a substrate with electronics coated with a material to be used as a nucleation layer for subsequent material deposition.
Figure 16:
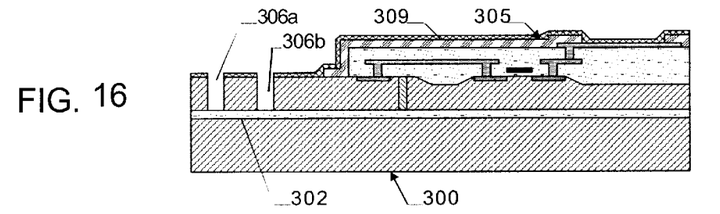
FIG. 16 is a cross-sectional view of a substrate in which a structural etch that, in part, defines a MEMS device has been performed.
Figure 17:
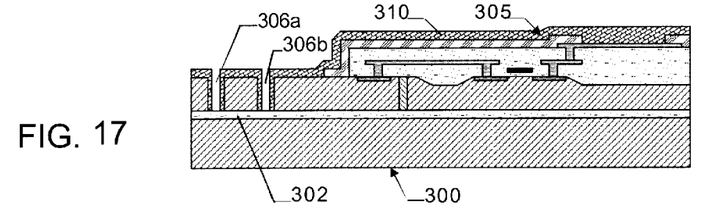
FIG. 17 is a cross-sectional view of a substrate after the selective deposition of a temporary release mask.
Figure 18:
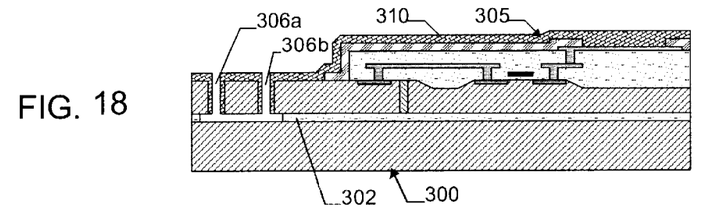
FIG. 18 is a cross-sectional view of a substrate after completion of a release etch.
Figure 19:
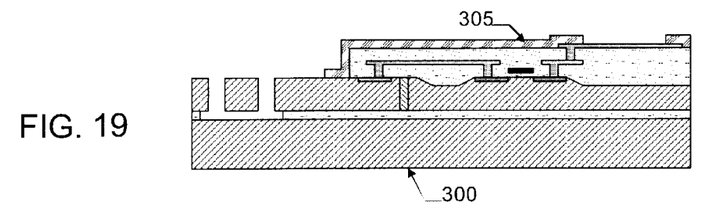
FIG. 19 is a cross-sectional view of a substrate after the removal of a temporary release mask.

Yet another embodiment of the invention is illustrated in FIG. 14 through FIG. 19. Starting material may comprise substrate 300 shown in FIG. 14 that may be exposed to a brief oxide etch to ensure that no undesired silicon oxide remains exposed. Substrate 300 may be coated with nucleation layer 309 that may include amorphous silicon or polycrystalline silicon/germanium as illustrated in FIG. 15. Alternatively, if portions of the substrate to be protected by deposited germanium comprise a surface layer upon which germanium may be directly deposited, formation of nucleation layer 309 may be skipped. Referring to FIG. 16, a MEMS structure definition exposes sacrificial material 302 through trenches 306a and 306b. A brief oxide etch may be performed to ensure that no silicon oxide remains on non-sacrificial surfaces. As shown in FIG. 17, germanium-rich, temporary release mask 310 is selectively deposited. Because temporary release mask 310 comprises germanium-rich polycrystalline silicon/germanium or poly-germanium, deposition is selective and temporary release mask 310 does not nucleate and grow on the sacrificial silicon oxide (see: Tsu-Jae King, Saraswat, K. C., "Deposition and properties of low-pressure chemical-vapor deposited polycrystalline silicon-germanium films," *Journal of the Electrochemical Society*, August 1994, pp. 2235–41.) When nucleation layer 309 and temporary release mask 310 materials are largely comprised of silicon and germanium and when the germanium content is sufficiently high and interdiffusion occurs, nucleation layer 309 and temporary release mask 310 become a layer of silicon/germanium that is sufficiently germanium-rich for removal by an oxidizing etch. As shown in FIG. 18, a release etch may be performed to remove sacrificial material 302 that is exposed through regions 306a and 306b. Temporary release mask 310 is then removed as illustrated in FIG. 19. When temporary release mask 310 is silicon/germanium, the material may be removed with an oxidizing etch.

The foregoing description, for the purposes of explanation, used specific nomenclature to provide a thorough understanding of the invention. However, it will be apparent to one skilled in the art that the specific details are not required in order to practice the invention. Thus, the foregoing descriptions of specific embodiments of the invention are presented for the purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. For instance, different gasses, times, and temperatures may be used to deposit silicon or germanium films. Additional cleaning steps may be added before or after deposition of the thin films, or between thin-film layer depositions. The starting material may comprise various exposed materials to be protected, including exposed metal bondpads comprising aluminum, aluminum/silicon, or aluminum with a thin barrier layer of a material such as titanium nitride, or platinum. Furthermore, the invention can be used in conjunction with a variety of MEMS processes for improved yield, manufacturability, and performance, for example: U.S. PPA Serial No. 60/127,973, Filed Apr. 6, 1999; U.S. patent application Ser. No. 09/322,381, filed May 28, 1999; Montague et al., U.S. Pat. No. 5,798,283 issued Aug. 25, 1998; Kung, et al., U.S. Pat. No. 5,504,026 issued Apr. 2, 1996; Sherman, et al., U.S. Pat. No. 5,847,280 issued Dec. 8, 1998; Tsang et al., U.S. Pat. No. 5,326,726, issued Jul. 5, 1994; Spangler et al., U.S. Pat. No. 5,343,064, issued Aug. 30, 1994; Bashir et al., U.S. Pat. No. 5,747,353, issued May 5, 1998; Zhang et al, U.S. Pat. No. 5,506,175 issued Apr. 9, 1996; Diem et al., U.S. Pat. No. 5,576,250, issued Nov. 19, 1996.

What is claimed is:

1. A method for forming released mechanical structures on the same substrate as protected regions, the method comprising the steps of:

(a) providing a substrate having protected regions, a first surface, and a sacrificial layer, said sacrificial layer including silicon dioxide;

(b) depositing a protective layer including germanium onto said first surface;

(c) photolithographically defining a release region in said protective layer where a mechanical structure will be released;

(d) removing portions of said protective layer including germanium at said release regions defined in said step (c), leaving remaining portions;

(e) releasing a microstructure by etching at least a portion of the sacrificial layer using an etchant including hydrogen fluoride; and (f) removing remaining portions of said protective layer including germanium.

2. A method for forming released mechanical structures on the same substrate as interconnections, the method comprising the steps of:

(a) providing a substrate having interconnections, a first surface, and a sacrificial layer, said sacrificial layer including silicon dioxide;

(b) depositing a protective layer including germanium onto said first surface;

(c) defining one or more mechanical structures into said first surface, thereby exposing a portion of said sacrificial layer by (c1) removing a portion of the protective layer overlying said first surface leaving remaining portions of said protective layer, and (c2) etching a trench from said first surface to said sacrificial layer;

(d) releasing said mechanical structure from said sacrificial layer by etching at least a portion of said sacrificial layer using an etchant including hydrogen fluoride, thereby forming a structure-released substrate; and (e) removing remaining portions of said protective layer including germanium.

3. The method of claim 2 wherein the substrate further includes integrated circuits having one or more transistors.

4. The method of claim 2 wherein said layer including germanium includes germanium and silicon in a molar ratio of germanium to silicon greater than 1:3.

5. The method of claim 2 wherein said step (b) comprises the following steps:

(b1) depositing a first layer of silicon; and (b2) depositing a first layer of germanium.

6. The method of claim 2 wherein said step (b) comprises the following steps:

(b1) depositing a first layer of silicon;

(b2) depositing a first layer of germanium;

(b3) depositing a second layer of silicon; and (b4) depositing a second layer of germanium.

7. The method of claim 2 additionally comprising a step, following said step (a), of:

(a1) exposing said substrate to a siliconoxide etchant selected from one of the following list: a plasma etch containing fluorine ions, a solution containing hydrogen fluoride.

8. The method of claim 2 wherein the thickness of said protective layer including germanium deposited in said step (b) is less than 2 microns.

9. The method of claim 2 wherein said step (e) comprises immersion of said structure-released substrate in a solution including hydrogen peroxide.

10. The method of claim 2 wherein said step (c) comprises the following steps:

(c1) photolithographically defining regions where portions of said substrate are to be removed;

(c2) etching completely though said layer including germanium in said photolithographically defined regions; and (c3) etching from exposed regions of said first surface through the substrate until the sacrificial layer is reached, thereby defining a mechanical structure.

11. The method of claim 10 wherein said step (c2) and said step (c3) are performed in a single reactive ion etcher, wherein the reactive ion species is generated from a gas comprising atoms selected from one of the following list: fluorine, chlorine, bromine.

12. The method of claim 2 wherein said step (c) comprises the following steps:

(c1) photolithographically defining a structure region where a mechanical structure will be formed;

(c2) etching said layer including germanium from said structure region wherein the etchant is selected from one of the following list: a plasma etch containing fluorine, a solution containing hydrogen peroxide;

(c3) photolithographically defining regions where portions of said substrate are to be removed; and (c4) etching from exposed regions of said first surface through the substrate until the sacrificial layer is reached, thereby defining a mechanical structure.

13. The method of claim 10 wherein said substrate comprises a silicon device layer and a handle substrate, wherein said silicon device layer is bonded to said handle substrate with said sacrificial layer, and said sacrificial layer comprises silicon dioxide.

14. The method of claim 12 wherein said substrate comprises a silicon device layer and a handle substrate, wherein said silicon device layer is bonded to said handle substrate with said sacrificial layer, and said sacrificial layer comprises silicon dioxide.

15. The method of claim 2 wherein said substrate further includes one or more active electrical devices selected from the following list: MOS transistor, BJT transistor, JFET transistor.

16. The method of claim 2 wherein said step (d) comprises immersion of said substrate in a solution including greater than 2% hydrogen fluoride by weight.

17. The method of claim 2 wherein said step (d) comprises immersion of said substrate in a solution including hydrogen fluoride for a period of time sufficient to laterally etch at least 5 microns of said sacrificial layer.

18. A method for forming released mechanical structures on the same substrate as interconnections, the method comprising the steps of:

(a) providing a substrate having a first surface, interconnections, a sacrificial layer, and one or more defined mechanical structures affixed to the sacrificial layer;

(b) depositing a mask layer including germanium onto said first surface;

(c) photolithographically defining a release region enclosing at least a portion of a defined mechanical structure;

(d) etching a portion of said mask layer including germanium from said release region to expose said first surface and leave remaining portions of said layer, wherein the etchant is selected from one of the following list: a plasma etch containing fluorine, a solution containing hydrogen peroxide;

(e) releasing said mechanical structure from said sacrificial layer by etching at least a portion of said sacrificial layer using an etchant including hydrogen fluoride, thereby forming a structure-released substrate; and (f) removing remaining portions of said layer including germanium.

19. The method of claim 18 wherein said defined mechanical structures are formed by surface micromachining.

20. The method of claim 18 wherein said defined mechanical structures are located within a recessed region below the surface of the substrate.

21. A method for forming released mechanical structures on the same substrate as interconnections, the method comprising the steps of:

(a) providing a substrate having interconnections, a first surface, and a sacrificial layer;

(b) defining one or more mechanical structures (by etching trenches from said first surface to said sacrificial layer) into said first surface, thereby exposing a portion of said sacrificial layer;

(c) selectively depositing a layer including germanium onto said substrate, wherein exposed portions of said sacrificial layer serve as a masking surface for said selective deposition;

(d) releasing said mechanical structure from said sacrificial layer by etching at least a portion of said sacrificial layer using an etchant including hydrogen fluoride, thereby forming a structure-released substrate;

(e) substantially removing remaining portions of said mask layer including germanium.

22. The method of claim 2 wherein the thickness of said layer including germanium deposited in said step (b) is greater than 200 nm.

23. The method of claim 2 wherein said mechanical structures comprise silicon mechanical structures.

* * * * *